United States Patent [19]
Ohmori et al.

[11] Patent Number: 5,677,393
[45] Date of Patent: Oct. 14, 1997

[54] HEAT-RESISTANT FILM ADHESIVE FOR USE IN FABRICATION OF PRINTED CIRCUIT BOARDS AND PROCESS FOR USING THE SAME

[75] Inventors: Fumihiro Ohmori, Kisarazu; Yukihiro Wada, Kitakyushu; Masatoshi Yuasa, Yokohama; Keiichirou Wada, Kiyose; Makoto Shimose, Kisarazu; Kenji Nakajima, Chiba; Misao Ohkubo, Tokushima, all of Japan

[73] Assignee: Nippon Steel Chemical Co., Ltd., Tokyo, Japan

[21] Appl. No.: 464,634

[22] PCT Filed: Dec. 27, 1993

[86] PCT No.: PCT/JP93/01902

§ 371 Date: Aug. 7, 1995

§ 102(e) Date: Aug. 7, 1995

[87] PCT Pub. No.: WO94/14911

PCT Pub. Date: Jul. 7, 1994

[30] Foreign Application Priority Data

Dec. 28, 1992 [JP] Japan ............... 4-361176

[51] Int. Cl.$^6$ ............... C08G 69/48; C09J 7/00; C09J 163/00; C09J 183/04
[52] U.S. Cl. ............... 525/423; 156/329; 156/330; 428/413; 428/447; 428/473.5; 428/901
[58] Field of Search ............... 525/423; 428/413, 428/458, 901, 473.5, 447; 156/330, 329, 331.5

[56] References Cited

U.S. PATENT DOCUMENTS

| | | |
|---|---|---|
| 4,277,583 | 7/1981 | Waitkus et al. ............... 525/423 |
| 4,543,295 | 9/1985 | St. Clair et al. . |
| 4,937,133 | 6/1990 | Watanabe et al. ............... 428/209 |
| 5,089,549 | 2/1992 | Kato ............... 524/287 |
| 5,108,825 | 4/1992 | Wojnarowski et al. ............... 428/209 |
| 5,147,943 | 9/1992 | Inoue et al. ............... 525/423 |
| 5,252,703 | 10/1993 | Nakajima et al. ............... 525/423 |
| 5,300,364 | 4/1994 | Hase et al. ............... 428/458 |
| 5,300,627 | 4/1994 | Kunimune et al. ............... 528/353 |

FOREIGN PATENT DOCUMENTS

| | | |
|---|---|---|
| 52-91082 | 8/1977 | Japan . |
| 60-210624 | 10/1985 | Japan . |
| 2-158681 | 6/1990 | Japan . |
| 4-23879 | 1/1992 | Japan . |
| 4-29393 | 1/1992 | Japan . |
| 4-36321 | 2/1992 | Japan . |
| 4-36366 | 2/1992 | Japan . |
| 4-41581 | 2/1992 | Japan . |
| 4-96962 | 3/1992 | Japan . |
| 5-25452 | 2/1993 | Japan . |
| 5-25453 | 2/1993 | Japan . |
| 5-140526 | 6/1993 | Japan . |

*Primary Examiner*—Ralph H. Dean
*Attorney, Agent, or Firm*—Nikaido Marmelstein Murray & Oram LLP

[57] ABSTRACT

This invention relates to heat-resistant film adhesives for use in fabrication of printed circuit boards formulated from polyimides with silicone units and epoxy resins and, if necessary, epoxy resin curing agents. It is possible to introduce functional groups reactive with epoxy resins into the polyimide structure. The films are used by inserting them between adherends and pressing at 1 to 1,000 kg/cm$^2$ and 20° to 250° C. and they show excellent heat resistance, heat resistance at soldering temperature after moisture absorption and processibility when contact-bonded at 250° C. or less.

5 Claims, No Drawings

HEAT-RESISTANT FILM ADHESIVE FOR USE IN FABRICATION OF PRINTED CIRCUIT BOARDS AND PROCESS FOR USING THE SAME

FIELD OF TECHNOLOGY

This invention relates to heat-resistant film adhesives for use in fabrication of printed circuit boards and, more particularly, to novel heat-resistant film adhesives containing polyimides with silicone units soluble in organic solvents and epoxy resins for use in printed circuit boards.

To be more specific, this invention relates to heat-resistant film adhesives which are useful for special applications such as fabrication of multilayer printed circuit boards by lamination of patterned layers, formation of composites of different circuit materials and bonding of a base material to another and hence relates to heat-resistant adhesives in the form of films which can fill the uneven surface of a patterned layer and exhibit high adhesive strength and good heat resistance and, in particular, good heat resistance at soldering temperature after moisture absorption.

BACKGROUND TECHNOLOGY

Base materials which have been used for printed circuit boards include phenolic resin-impregnated paper, epoxy resin-impregnated glass fibers and laminates of polyimide or poly(ethylene terephthalate) films and metal foils.

In recent years, a decrease in the wiring area in printed circuit boards in the fields of electric and electronic equipment and precision equipment has created a rising demand for multilayer printed circuit boards. A variety of adhesives and adhesive films are used in fabrication of multilayer printed circuit boards by lamination of patterned layers and in formation of composites from different circuit materials.

Known examples of such adhesives are prepregs prepared by impregnating woven glass fibers with epoxy resins or bismaleimide resins. However, they have presented problems such as insufficient flexibility and poor dimensional stability.

A number of proposals have been made for using adhesives based on acrylonitrile-butadiene rubber/phenolic resin, phenolic resin/butyral resin and acrylonitrile-butadiene rubber/epoxy resin [Japan Kokai Tokkyo Koho Nos. Hei 4-29,393 (1992), Hei 4-36,366 (1992) and Hei 4-41,581 (1992)]. These adhesives, however, are not sufficient in chemical and heat resistance and deteriorate markedly under heat. Moreover, they are not satisfactory in heat resistance at soldering temperature after moisture absorption and also in processibility on account of such defects as generation of smears during drilling of through-holes.

Polyimide-based adhesives with excellent heat resistance have been proposed in recent years and adhesives based on thermoplastic polyimides are disclosed, for example, in U.S. Pat. No. 4,543,295. However, bonding of base materials such as copper foils and polyimide films with the aforementioned polyimides requires heat contact bonding at a temperature of 250° C. or more for development of satisfactory adhesive strength and this makes it difficult to put them to practical use.

Adhesives based on polyimides from diaminopolysiloxanes and aromatic tetracarboxylic acids are proposed for heat contact bonding at low temperature [Japan Kokai Tokkyo Koho No. Hei 4-23,879 (1992)]. Polyimides of this kind alone, however, suffered from such shortcomings as insufficient adhesive strength and poor reliability.

Film adhesives composed of polyamideimides and epoxy resins are disclosed as polyimide-based adhesives of high adhesive strength for the manufacture of copper-clad films for flexible printed circuit boards in Japan Kokai Tokkyo Koho No. Sho 52-91,082 When films such as those set forth above, are used to bond patterned layers with uneven surfaces in the fabrication of multilayer printed circuit boards, they are not able to fill the gap between the patterned layers satisfactorily nor do they develop sufficient heat resistance to withstand dipping in a soldering bath.

In consequence, either for use in fabrication of multilayer printed circuit boards or for use in film overlay, a demand has grown for adhesives which can be used in heat contact bonding at a low temperature of 250 ° C. or less and yet perform well in such properties as adhesive strength, chemical resistance, heat resistance, heat resistance at soldering temperature after moisture absorption and dimensional stability during wiring.

Accordingly, it is an object of this invention to provide heat-resistant film adhesives for use in fabrication of printed circuit boards amenable to heat contact bonding at 250° C. or less with excellent heat resistance, heat resistance at soldering temperature after moisture absorption and processibility.

DISCLOSURE OF THE INVENTION

This invention thus relates to heat-resistant film adhesives which comprise 70 to 99% by weight of polyimides with silicone units and 1 to 30% by weight of epoxy resins and are suitable for use in fabrication of printed circuit boards.

This invention further relates to heat-resistant film adhesives which comprise 70 to 98% by weight of polyimides with silicone units, 1 to 15% by weight of epoxy resins and 1 to 15% by weight of epoxy resin curing agents and are suitable for use in fabrication of printed circuit boards.

The epoxy resins to be used in this invention are not limited to specific ones as long as they can be blended with polyimides and they are desirably liquid or powdered epoxy resins with an epoxy equivalent of 500 or less. An epoxy equivalent in excess of 500 tends to degrade the adhesive strength and heat resistance. Concrete examples of acceptable epoxy resins are glycidyl ethers derived from phenols such as bisphenol A, bisphenol F, bisphenol S, fluorenebisphenol, 4,4'-biphenol, 2,2'-biphenol, hydroquinone and resorcinol, from trihydric or higher phenols such as tris(4-hydroxyphenyl)methane, 1,1,2,2-tetrakis(4-hydroxyphenyl)ethane, phenol novolaks and o-cresol novolaks and from halogenated bisphenols such as tetrabromobisphenol A. These epoxy resins may be used singly or as a mixture of two or more.

Polyimides with silicone units desirable for use in this invention are those which are readily soluble in solvents and possess good film-forming properties. Useful as such solvent-soluble polyimides are aromatic radical-containing polyimides having a repeating unit represented by the following general formula (1)

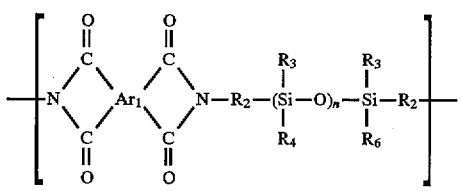

(wherein $Ar_1$ is a tetravalent aromatic radical, $R_1$ and $R_2$ are divalent hydrocarbon radicals, $R_3$ to $R_6$ are hydrocarbon radicals having 1 to 6 carbon atoms and n is an integer from 1 to 20) and a repeating unit represented by the following general formula (2)

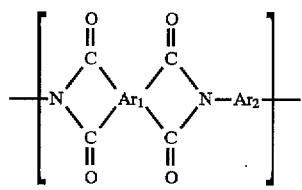

(wherein $Ar_1$ is a tetravalent aromatic radical, $Ar_2$ is a divalent aromatic radical), with at least 1 mol % of the $Ar_2$ radical in the aforementioned general formula (2) being represented preferably by the following general formula (3)

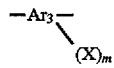

(wherein $Ar_3$ is a trivalent or tetravalent aromatic radical, X is hydroxyl, amino or carboxyl group and m is 1 or 2).

Polymides having the repeating units represented by the aforementioned general formulas (1) and (2) are prepared by the reaction of diaminosiloxanes, aromatic diamines and tetracarboxylic acid dianhydrides.

Preferable examples of tetracarboxylic acid dianhydrides are 3,3',4,4'-diphenylethertetracarboxylic acid dianhydride, 3,3',4,4'-diphenylsulfonetetracarboxylic acid dianhydride, 3,3',4,4'-benzophenonetetracarboxylic acid dianhydride and 2,2',3,3'-benzophenonetetracarboxylic acid dianhydride. Other tetracarboxylic acid dianhydrides which can be used as part of the requirements for the aforementioned dianhydrides are 3,3',4,4'-biphenyltetracarboxylic acid dianhydride, 2,3,3',4'-biphenyltetracarboxylic acid dianhydride, pyromellitic anhydride, 1,4,5,8-naphthalenetetracarboxylic acid dianhydride, 1,2,5,6-naphthalenetetracarboxylic acid dianhydride, 3,4,9,10-perylenetetracarboxylic acid dianhydride, 2,3,6,7-anthracenetetracarboxylic acid dianhydride, 1,2,7,8-phenanthrenetetra-carboxylic acid dianhydride and 4,4'-(hexafluoroisopropylidene) diphthalic acid dianhydride.

On the other hand, diaminosiloxanes useful for the reaction are those represented by the following general formula (4)

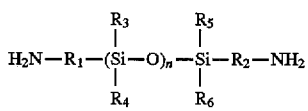

(wherein $R_1$ and $R_2$ are divalent hydrocarbon radicals, $R_3$ to $R_6$ are hydrocarbon radicals having 1 to 6 carbon atoms and n is an integer from 1 to 20).

Preferable examples of these diaminosiloxanes are shown below. The average number of n in them is preferably in the range from 1 to 20, more preferably from 5 to 15. When n is outside the lower limit of this range, heat-resistant film adhesives undesirably deteriorate in their ability to fill an uneven surface. On the other hand, when n is outside the upper limit of this range, film adhesives lose their adhesive strength. Introduction of silicone units into polyimides with the use of these diaminosiloxanes provides heat-resistant film adhesives of this invention with good flow during heat contact bonding and improves their ability to fill the surface of printed circuit boards.

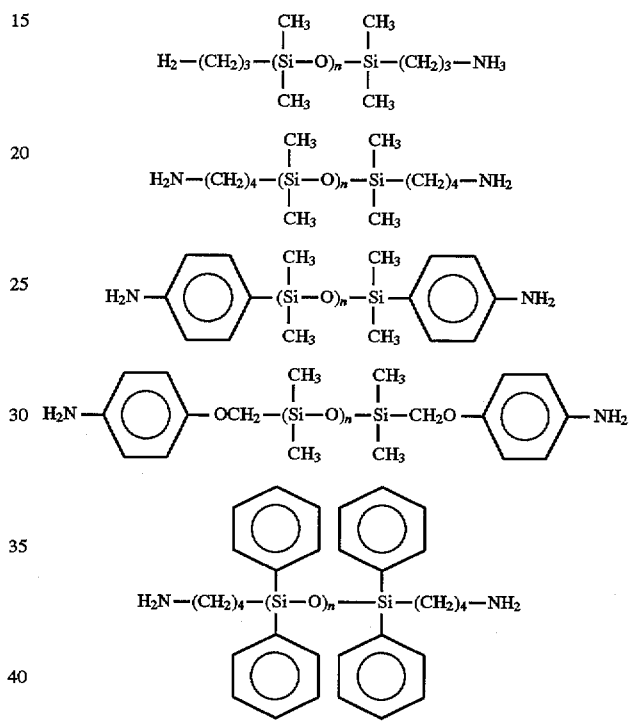

Concrete examples of aromatic diamines are m-phenylenediamine, p-phenylenediamine, 4,4'-diaminodiphenylpropane, 4,4'-diaminodiphenylmethane, benzidine, 4,4'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether and 4,4'-diamino-p-terphenyl. In order to improve solubility in organic solvents, however, it is desirable to use diamines containing three or more aromatic rings such as 2,2-bis(3-aminophenoxyphenyl)propane, 2,2-bis(4-aminophenoxyphenyl)propane, 3,3-bis(3-aminophenoxyphenyl) sulfone, 4,4-bis(3-aminophenoxyphenyl) sulfone, 3,3-bis(4-aminophenoxyphenyl) sulfone, 4,4-bis(4-aminophenoxyphenyl) sulfone, 2,2-bis(3-aminophenoxyphenyl)hexafluoropropane, 2,2-bis(4-aminophenoxyphenyl)hexafluoropropane, 1,4-bis(4-aminophenoxy)benzene, 1,3-bis(4-aminophenoxy)benzene, 4,4-(p-phenylenediisopropylidene) bisaniline and 4,4-(m-phenylenediisopropylidene)bisaniline.

Furthermore, it is desirable to use diamines represented by the following general formula (3)

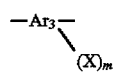

(wherein Ar$_3$ is a trivalent or tetravalent aromatic radical, X is hydroxyl, amino or carboxyl group and m is 1 or 2) and containing functional groups reactive with epoxy resins as a part of the aforementioned aromatic diamines. Such aromatic diamines containing functional groups which are reactive with epoxy resins include 2,5-diaminophenol, 3,5-diaminophenol, 4,4'-(3,3'-dihydroxy)diaminobiphenyl, 4,4'-(2,2'-dihydroxy)diaminobiphenyl, 2,2'-bis(3-amino-4-hydroxyphenyl) hexafluoropropane, 3,3',4,4'-tetraaminobiphenyl, 3,3',4,4'-tetraaminodiphenyl ether, 4,4'-(3,3'-dicarboxy)diphenylamine and 3,3'-dicarboxy-4,4'-diaminodiphenyl ether. Particularly preferable are 4,4'-(3,3'-dihydroxy)diphenylamine and 4,4'-(2,2'-dihydroxy)diphenylamine. These aromatic diamines react with epoxy resins during heat contact bonding to form a crosslinked structure and contribute to improve further the adhesive strength and chemical resistance of the heat-resistant adhesives of this invention. It is desirable to use the aforementioned aromatic diamines containing functional groups reactive with epoxy resins in an amount of 1 mol % or more, more desirably in the range from 1 to 10 mol %, of the total aromatic diamines.

The reaction of aforementioned diaminosiloxanes, aromatic diamines and tetracarboxylic acid dianhydrides in a solvent followed by ring closure under heat of the resulting precursors yields polyimides containing the repeating units represents by the aforementioned general formulas (1) and (2). Here, the ratio of the repeating unit represented by the general formula (1) to that represented by the general formula (2) is desirably in the range from 50/50 to 10/90. A ratio outside this range does not produce the effects of this invention.

The mix ratio of the aforementioned polyimides with silicone units and epoxy resins is 70 to 99% by weight of polyimides and 1 to 30% by weight of epoxy resins. A formulation in this range can improve the heat resistance and the adhesive strength further without deteriorating the characteristic properties of polyimides.

It is allowable, as needed, to add epoxy resin curing agents to the polyimides and epoxy resins in order to accelerate curing of the resins. Concrete examples of epoxy resin curing agents are phenolic compounds such as phenolic novolaks, o-cresol novolaks and phenolic resols, amines such as diethylenetriamine and acid anhydrides such as pyromellitic anhydride and phthalic anhydride.

In the cases where epoxy resin curing agents are used, it is desirable to use a formulation of 70 to 98% by weight of polyimides, 1 to 15% by weight of epoxy resins and 1 to 15% by weight of epoxy resin curing agents.

In addition to the aforementioned ingredients, it is permissible in this invention to use, as needed, known curing accelerators, coupling agents, fillers and pigments.

Heat-resistant adhesives of this invention containing the aforementioned ingredients are used after molded into films and the conversion into films can be accomplished by a known process. For example, a mixture of polyimides, epoxy resins and other ingredients is dissolved in a solvent and the resulting solution is applied to a base such as a release agent-coated metal foil, polyester film or polyimide film by a known method, dried, and peeled off the base to yield a heat-resistant film adhesive of this invention for use in fabrication of printed circuit boards.

Typical solvents useful for the aforementioned film-forming process are amides, ethers, esters, alcohols and the like such as the following: N,N-dimethylformamide, N,N-diethylformamide, N,N-dimethylacetamide, N,N-diethylacetamide, N,N-dimethylmethoxyacetamide, dimethyl sulfoxide, N-methyl-2-pyrrolidone, tetrahydrofuran, diethylene glycol dimethyl ether, diethylene glycol diethyl ether, dioxane, γ-butyrolactone, xylenol, chlorophenol, phenol, methyl cellosolve, ethyl cellosolve, methyl cellosolve acetate, ethyl cellosolve acetate, toluene, xylene and methyl ethyl ketone. The solvent used in the preparation of the aforementioned polyimides may be used as it is in the film-forming step without ill effect.

Heat-resistant film adhesives of this invention are used advantageously as follows. A film adhesive is inserted between adherends such as flexible printed circuit boards, glass fiber-epoxy wiring boards, paper-phenolic wiring boards, metals and resin base materials, pressed together at a temperature of 20° C. to 250° C. and at a pressure of 1 to 100 kg/cm$^2$, and preferably heated further at a temperature of 50° to 250° C. for a specified length of time to effect complete curing of the epoxy resins and form an adhesive layer between the adherends.

The polyimides with silicone units useful for films of this invention are soluble in solvents and this enables formation of composites with epoxy resins. In addition, the polyimides exhibit high flow during heat contact bonding on account of the presence of silicone units in them, resulting in excellent filling of and strong adhesion to adherends. The epoxy-reactive aromatic diamines in use undergo crosslinking with epoxy resins and help to form an adhesive layer of high strength and excellent heat resistance. Moreover, low glass transition temperature of the film adhesives of this invention enables them to be bonded at a much lower temperature compared with the conventional polyimide-based adhesives.

DETAILED DESCRIPTION OF THE PREFERRED EMBODIMENTS

This invention will be described in detail below with reference to the accompanying experimental examples (examples and comparative examples).

The abbreviations used therein refer to the following compounds.

ODPA: 3,3',4,4'-Diphenylethertetracarboxylic acid dianhydride

DSDA: 3,3',4,4'-Diphenylsulfonetetracarboxylic acid dianhydride

BTDA: 3,3',4,4'-Benzophenonetetracarboxylic acid dianhydride

BPDA: 3,3',4,4'-Biphenyltetracarboxylic acid dianhydride

BAPP: 2,2'-Bis(4-aminophenoxyphenyl)propane

BAPS: Bis(4-aminophenoxyphenyl) sulfone mBAPS: Bis(3-aminophenoxyphenyl) sulfone BisAM: 1,3-Bis(aminoisopropyl)benzene DABP: 3,3'-Diaminobenzophenone HAB: 4,4'-(3,3'-Dihydroxy)diaminobiphenyl oDAP: 2,5-Diaminophenol HFP: 2,2'-Bis(3-amino-4-hydroxyphenyl) hexafluoropropane PSX-A: Diaminosiloxane with an average molecular weight of 740

PSX-B: Diaminosiloxane with an average molecular weight of 1,000

PSX-C: Diaminosiloxane with an average molecular weight of 1,240

PSX-D: Diaminosiloxane with an average molecular weight of 2,000
DGEBA: Bisphenol A-based epoxy resin
oCNB: o-Cresol novolak epoxy resin
BCNB: Bromocresol novolak epoxy resin
PNB: Phenol novolak resin

EXPERIMENTAL EXAMPLE 1

As shown in Table 1, 37.14 g (0.11 mol) of ODPA, 200 g of N-methyl-2-pyrrolidone and 200 g of diethylene glycol dimethyl ether were introduced into a 1 l separable flask and mixed well at room temperature. To the mixture was then added 31.56 g (n=8.4, 0.035 mol) of PSX-A with the aid of a dropping funnel, the reaction solution was stirred with ice cooling, and 1.52 g (0.01 mol) of oDAP, 30.25 g (0.07 mol) of BAPP and 1.04 g (0.005 mol) of HAB were added to the solution and stirred at room temperature for 2 hours to yield a polyamic acid solution.

The polyamic acid solution was heated up to 190° C. and held at this temperature with stirring for 20 hours to yield a polyimide solution with a logarithmic viscosity of 0.9 dl/g.

The polyimide solution, 75 parts by weight as solid, was mixed with 25 parts by weight of bisphenol A-based epoxy resin (Epikote 828 manufactured by Yuka Shell Epoxy K.K.) and stirred at room temperature for 2 hours to prepare a solution of adhesive resins. The solution was applied to a glass plate and dried to yield a heat-resistant film adhesive with a glass transition temperature of 120° C. and a 5% weight loss temperature of 450° C. in an atmosphere of nitrogen. The film adhesive was tested for its tensile strength, specific inductive capacity and volume resistivity in accordance with JIS C 2330. The results are shown in Table 2.

The heat-resistant film adhesive thus obtained was inserted between two polyimide films (APICAL, tradename of polyimide film manufactured by Kanegafuchi Chemical Industry Co., Ltd.) and pressed at 200° C. and 25 kg/cm$^2$ for 60 minutes. The adhesive strength determined by the 180-degree peel test was 2.6 kg/cm. Likewise, the film adhesive was inserted between two oxidation-treated copper foils, pressed, and tested for the adhesive strength, which was 1.8 kg/cm. The bonded copper foils were immersed in a soldering bath at 300° C. for 30 seconds and observed for the condition of adhesion. No defect such as blistering and delamination was found, which indicated good heat resistance at soldering temperature.

EXPERIMENTAL EXAMPLES 2 to 23

Film adhesives were prepared as in Experimental Example 1 from the compositions shown in Table 1 and tested for their properties. The results are shown in Table 2.

TABLE 1

| Experimental example No. | Polyimide (wt %) | | | Epoxy resin (wt %) | Epoxy resin curing agent (wt %) |
|---|---|---|---|---|---|
| | Aromatic tetracarboxylic acid (mol) | Aromatic diamine (mol) | Diaminosiloxane (mol) | | |
| 1 | ODPA 0.11 | BAPP 0.07  HAB 0.005 | PSX-AO. 035 | 75 DGBBA 25 | — |
| 2 | ODPA 0.11 | BAPP 0.07  HAB 0.005 | PSX-AO. 035 | 80 oCNB 20 | — |
| 3 | ODPA 0.11 | BAPS 0.06  HAB 0.003 | PSX-BO. 047 | 80 oCNB 20 | — |
| 4 | DSDA 0.12 | BAPP 0.07  HAB 0.004 | PSX-AO. 036 | 70 oCNB 20 | PNB 10 |
| 5 | DSDA 0.11 | BAPS 0.06  oDAP 0.005 | PSX-CO. 045 | 80 BCNB 20 | — |
| 6 | DSDA 0.13 | mBAPS 0.06  HFP 0.004 | PSX-DO. 046 | 80 BCNB 20 | — |
| 7 | DSDA 0.11 | BisAM 0.07  HAB 0.005 | PSX-AO. 035 | 80 oCNB 20 | — |
| 8 | BPDA 0.11 | BisAM 0.07  HAB 0.005 | PSX-AO. 035 | 75 oCNB 25 | — |
| 9 | BTDA 0.12 | mBAPS 0.06  HAB 0.005 | PSX-AO. 035 | 75 DGEBA 25 | — |
| 10 | ODPA 0.11 | BAPP 0.07  HAB 0.005 | PSX-AO. 035 | 70 oCNB 20 | PNB 10 |
| 11 | DSDA 0.11 | BAPP 0.07  HAB 0.005 | PSX-AO. 035 | 75 BCNB 25 | — |
| 12 | DSDA 0.11 | BAPP 0.06  HAB 0.003 | PSX-BO. 047 | 75 oCNB 25 | — |

TABLE 2

| | | Experimental example No. | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Glass transition temperature | (°C.) | 120 | 125 | 145 | 140 | 165 | 170 | 130 | 150 | 155 | 145 | 142 | 138 |
| Thermal decomposition temperature | (°C.) | 450 | 410 | 430 | 445 | 410 | 420 | 410 | 430 | 450 | 432 | 448 | 434 |
| Tensile strength | (kg/cm$^2$) | 7.2 | 7.4 | 6.0 | 7.6 | 6.8 | 5.7 | 7.5 | 7.1 | 6.7 | 7.0 | 7.8 | 6.4 |
| Specific inductive capacity | | 3.1 | 2.9 | 3.0 | 2.9 | 3.0 | 3.1 | 2.9 | 3.0 | 3.1 | 3.2 | 2.9 | 2.9 |

TABLE 2-continued

| | | Experimental example No. | | | | | | | | | | | |
|---|---|---|---|---|---|---|---|---|---|---|---|---|
| | | 1 | 2 | 3 | 4 | 5 | 6 | 7 | 8 | 9 | 10 | 11 | 12 |
| Volume resistivity | (× $10^{15}$ Ωcm) | 2 | 3 | 2 | 3 | 2 | 2 | 2 | 2 | 2 | 2 | 2 | 2 |
| Adhesive strength[1] | (kg/cm) | 1.8 | 1.5 | 1.8 | 1.8 | 1.9 | 1.8 | 1.6 | 1.5 | 1.6 | 1.9 | 1.9 | 1.7 |
| Adhesive strength[2] | (kg/cm) | 1.2 | 1.0 | 1.2 | 1.1 | 1.3 | 1.2 | 1.2 | 1.1 | 1.1 | 1.3 | 1.1 | 1.2 |
| Adhesive strength[3] | (kg/cm) | 2.6 | 2.4 | 2.2 | 2.4 | 2.6 | 2.4 | 2.2 | 2.0 | 2.0 | 2.6 | 2.6 | 2.6 |
| Heat resistance at soldering temperature[4] | (°C.) | >300 | >300 | >300 | >300 | >300 | >300 | >300 | >300 | >300 | >300 | >300 | >300 |
| Heat resistance at soldering temperature[5] | (°C.) | 300 | 290 | 300 | 300 | 290 | 300 | 300 | 280 | 290 | 300 | 300 | 300 |

[1] 180-Degree peel strength against oxidation-treated copper
[2] 180-Degree peel strength against sulfuric acid-treated copper
[3] 180-Degree peel strength against polyimide film
[4] Determined by inspection of blistering, delamination and appearance after immersion in a soldering for 30 seconds
[5] Determined by inspection of blistering, delamination and appearance after conditioning at 40° C. and 90% relative humidity for 24 hours followed by immersion in a soldering bath for 30 seconds Experimental Examples 1 to 18 constitute examples of this invention and the adhesive strength and heat resistance at soldering temperature are excellent in Experimental Examples 1 to 14 and good in Experimental Examples 15 to 18. Experimental Examples 19 to 23 constitute comparative examples outside the range of this invention and relate to films prepared for a comparative study in the same manner as in this invention from the conventional adhesive compositions. The last films are poorer in both adhesive strength and heat resistance at soldering temperature.

EXPERIMENTAL EXAMPLE 24

The heat-resistant film adhesive prepared in Experimental Example 1 was inserted between two sets of flexible printed circuit boards each of which consists of a polyimide film with circuits formed by copper on both sides and the assembly was pressed at 200° C. and 25 kg/cm² for 60 minutes and drilled for through-holes without smears to yield a multilayer printed circuit board of good chemical resistance and dimensional stability.

The multilayer printed circuit board thus obtained was immersed in a soldering bath at 300° C. for 30 seconds without such defects as blistering and delamination.

EXPERIMENTAL EXAMPLE 25

As in Experimental Example 24, the heat-resistant film adhesive prepared in Experimental Example 10 was used to fabricate a multilayer printed circuit boards. Through-holes of good quality were drilled without smearing and the multilayer printed circuit board showed good chemical resistance and dimensional stability and developed none of such defects as blistering and delamination when immersed in a soldering bath at 300° C. for 30 seconds.

INDUSTRIAL APPLICABILITY

Heat-resistant film adhesives of this invention for use in fabrication of printed circuit boards can be contact-bonded under heat at a temperature lower than that for the conventional polyimide-based adhesives without deterioration of the heat resistance and electrical characteristics inherent in polyimides.

In consequence, the heat-resistant film adhesives of this invention are useful as adhesives for multilayer printed circuit boards, composite circuit boards and coverlay films.

What is claimed is:

1. A heat-resistant film adhesive which comprises: 70 to 99% by weight of a polyimide comprising:

polyimide repeating units represented by the following general formula (1):

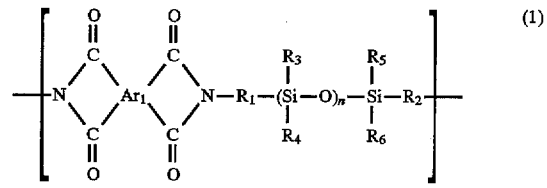

wherein $Ar_1$ is a tetravalent aromatic radical, $R_1$ and $R_2$ are divalent hydrocarbon radicals, $R_3$ to $R_6$ are hydrocarbon radicals having 1 to 6 carbon atoms, and n is an integer from 1 to 20; and polyimide repeating units represented by the following general formula (2):

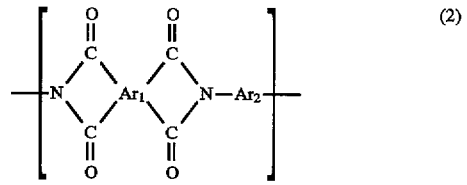

wherein $Ar_1$ is a tetravalent aromatic radical and $Ar_2$ is divalent aromatic radical; and 1 to 30% by weight of epoxy resins;

wherein the ratio of polyimide repeating units (1) to polyimide repeating units (2) is 47/63 to 10/90, and 1 mol % to less than 10 mol % of the radical $Ar_2$ in the general formula (2) is a divalent aromatic radical having functional groups reactive with epoxy resins represented by the following general formula (3):

wherein $Ar_3$ is a trivalent or tetravalent aromatic radical, X is hydroxyl, amino or carboxyl group, and m is 1 or 2.

2. A heat-resistant film adhesive as claimed in claim 1, wherein the epoxy resin has an epoxy equivalent of 500 or less.

3. A multilayer printed circuit assembly comprising:
at least two sets of printed circuit boards of which at least one side of sides faced each other has a circuit; and
one or more adhesives as claimed in claim 1 which are disposed between said at least two sets of printed circuit boards;

wherein each of said adhesives is subjected to heat contact bonding at a pressure of 1 to 100 kg/cm² and a temperature of 20° to 250° C.

4. A printed circuit assembly comprising a circuit adhered to a backing board through a heat-resistant film adhesive as claimed in claim 1.

5. A process for forming a heat resistant laminate comprising:

disposing an adhesive as claimed in claim 1 between adherends to form an assembly; and subjecting said assembly to heat contact bonding at a pressure of 1 to 100 kg/cm² and a temperature of 20° to 250° C.

* * * * *